United States Patent [19]

Vice

[11] 4,158,400

[45] Jun. 19, 1979

[54] SOUND REPRODUCING SYSTEM

[76] Inventor: Charles L. Vice, 9881 Verde Lomas Cir., Villa Park, Calif. 92667

[21] Appl. No.: 906,119

[22] Filed: May 15, 1978

[51] Int. Cl.[2] ..... H05K 5/00

[52] U.S. Cl. ..... 181/152; 181/144; 181/156; 181/159

[58] Field of Search ..... 181/152, 159, 144, 192, 181/156, 199; 179/115.5 H

[56] References Cited

U.S. PATENT DOCUMENTS

| | | | |
|---|---|---|---|
| 1,792,655 | 2/1931 | Norton | 181/192 |
| 1,843,524 | 2/1932 | Stenger | 181/159 |
| 1,878,018 | 9/1932 | Stephens | 181/159 |
| 1,878,088 | 9/1932 | Zwikker | 181/159 |
| 1,943,499 | 1/1934 | Williams | 181/159 |
| 2,615,995 | 10/1952 | Voigt | 181/159 |
| 2,900,040 | 8/1959 | Novak | 181/152 |
| 3,356,179 | 12/1967 | Tompkins | 181/152 |

*Primary Examiner*—Stephen J. Tomsky
*Attorney, Agent, or Firm*—Donald D. Mon

[57] ABSTRACT

A cone speaker is mounted to a horn within a reflex chamber behind a forward opening through the chamber, and the forward end of a horn is attached to the opening. The speaker is connected in the entrance discharging rearwardly into the chamber, and forwardly into the horn. The horn includes a restriction between the forward end of the horn and the speaker, and ports are formed through the horn, entering the restriction.

8 Claims, 5 Drawing Figures

SOUND REPRODUCING SYSTEM

This invention relates to sound producing systems of the type having a cone type speaker in a reflex chamber provided with a horn.

It is known to place a cone speaker in a reflex chamber having a horn. It is also known to locate the entrance opening of the horn at the speaker cone so that the cone constitutes a wall separating the reflex chamber from the horn and providing no air communication between the chamber and the entrance to the horn. In such a system there occurs undesirable raggedness and distortions of the response at the lower cut-off frequency end of the horn.

An example of a prior known arrangement is that shown in Tompkins U.S. Pat. No. 3,356,179 issued Dec. 5, 1967, which shows a horn in front of a speaker, having side walls enclosing a sound chamber. A number of holes are placed through the side walls of the horn at different positions so that air paths of different lengths are provided between the horn and the chamber. The purpose of this arrangement is to extend the frequency response range of a relatively small speaker capable of reproducing high frequency sounds, so that there can also be produced a low frequency or base response. There are, however, disruptive and distorting effects inherent in such a structure, and for a number of reasons its frequency response is not uniform throughout the audible range.

Other known systems are shown in the following patents:

U.S. Pat. No. 1,843,524—Stenger
U.S. Pat. No. 1,878,018—Stephens
U.S. Pat. No. 1,943,499—Williams
U.S. Pat. No. 2,615,995—Voigt
U.S. Pat. No. 2,900,040—Novak
U.S. Pat. No. 3,356,179—Tompkins An object of the present invention is tô provide a sound reproducing arrangement capable of a smooth and uniform response throughout a wide audible range with minimal hangover and distortion.

A related object is to provide for full loading of the horn at its throat.

The invention is carried out by placing a horn at a forward opening in a reflex chamber and mounting a cone type speaker within the chamber behind the opening and discharging rearwardly into the chamber and forwardly into the horn. The speaker is fluidly sealed to the horn's entrance. Intercommunication between the reflex chamber and the interior of the horn is through a plurality of ports in the wall of the horn. The horn includes a restriction between the forward opening and the speaker, and the ports enter the horn only at the restriction.

According to a feature of the invention, the restriction is formed by the inside wall of the horn and the outside wall of a woofer.

The invention will be fully understood from the following detailed description and the accompanying drawings in which.

Figure 1:
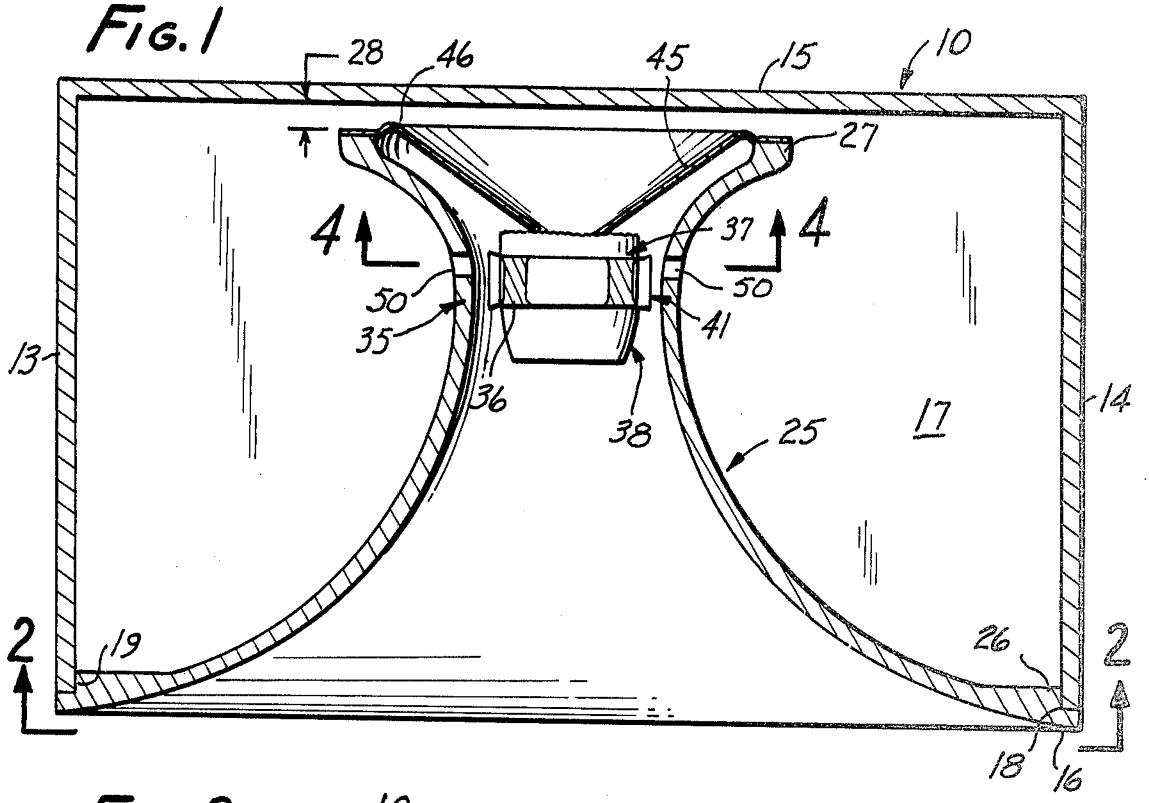
FIG. 1 is a cross-section of the presently-preferred embodiment of the invention taken at line 1—1 in FIG. 2.
Figure 2:
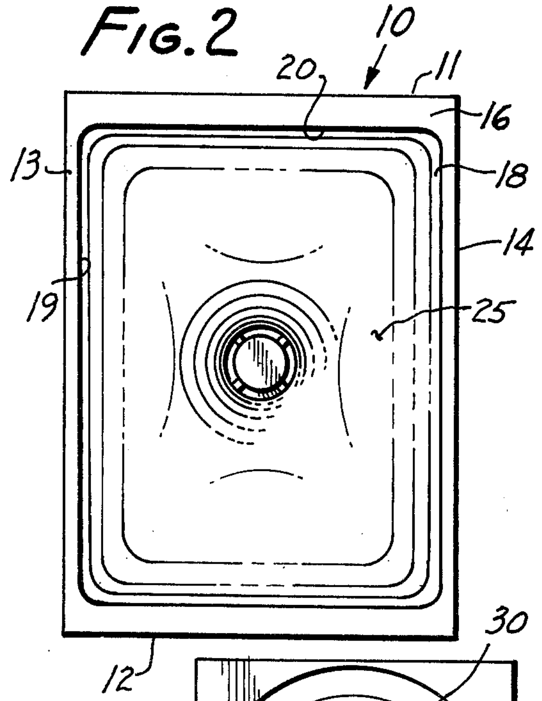
FIG. 2 is a front view, taken at line 2—2 in FIG. 1.
Figure 3:
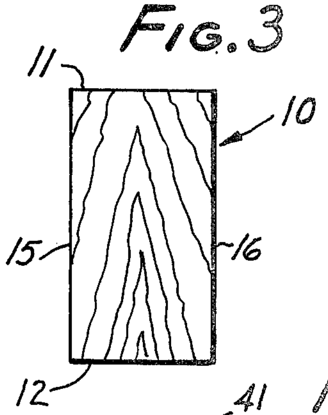
FIG. 3 is a left hand view of FIG. 2.
Figure 4:
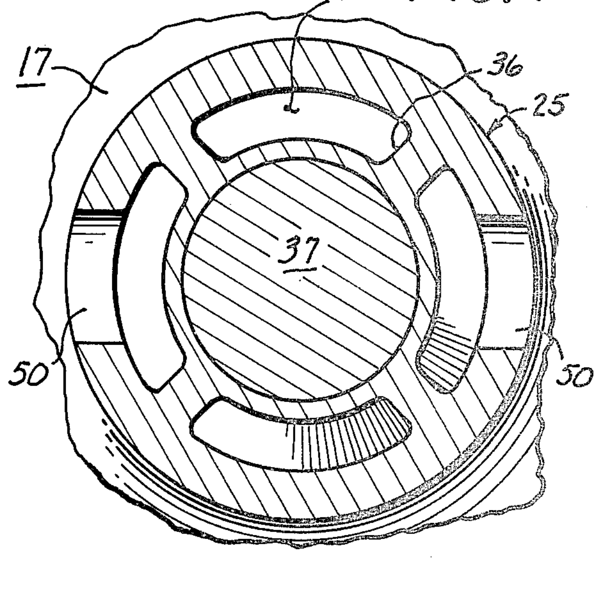
FIG. 4 is a cross-section taken at line 4—4 in FIG. 1.

Referring to the embodiment of FIGS. 1–4, there is shown an enclosure 10 having the general form of a rectangular prism formed by top and bottom walls 11 and 12, side walls 13 and 14, a rear wall 15 and a front wall 16. These walls provide a chamber 17 with an opening 18 through the front wall 16, and it will be recognized that chamber 17 is a so-called reflex chamber. The opening is rectangular, being formed by vertical edges 19 and horizontal edges 20.

An exponential-type horn 25 is mounted to the enclosure at its larger forward end 26. End 26 fills opening 18. The smaller rearward end 27 of the horn is spaced from the rear wall by a spacing 28. This horn is circular at its rear end, and gradually converts to a rectangular configuration at its forward end.

Figure 5:
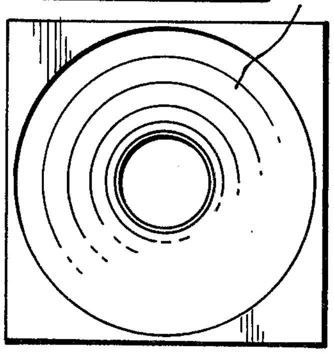
FIG. 5 shows another useful form of horn.

Horn shapes other than circular-to-rectangular are useful. For example, FIG. 5 shows a circular horn 20 which can be directly substituted for horn 25. It is circular from its rear end to its front end. The opening in the enclosure will be changed to circular to mount this horn. Other shapes, such as ovular, can also be used. All other details of this invention are identical, whatever is the shape of the horn.

Horn 25 has a throat 35, and enlarges in both directions from this throat. The throat is the least inside diameter.

A group of flanges or struts 36 are mounted to the inside of the horn, and serve to mount a woofer 37. Their cross-section is exaggerated in FIG. 4. They will be kept as thin as possible. because their area must be subtracted from the gross clearance between the walls of the horn and woofer in calculating the area of a throat restriction yet to be described. The term "woofer" means a driver for the lower frequencies. The woofer is conventional and will not be described in detail. It includes a conventional magnet and voice coil (not shown), and connections to a source of driving current.

A conventional tweeter 40 is mounted to the woofer, and faces toward the forward end of the horn. Connections (not shown) are provided for driving current. The term "tweeter" means a driver for the higher frequencies.

A throat restriction 41 is formed by and between the inside wall of the throat and the outside wall of the woofer. It is not necessary that these walls be circular. They can be ovular or even polygonal, if desired, depending on the shape of the horn. However, the total area left open between them is of consequence, and is called the "area of the throat restriction".

A conventional speaker cone 45 is mounted to the rearward end of the horn. It is a conventional conical speaker connected in known manner to the voice coil of the woofer. The cone faces rearwardly (i.e., it enlarges toward the rear wall, and primarily discharges rearwardly). Its forward face opens in to the inside of the horn. A conventional flexible seal 46 closes the rear end of the horn to the speaker cone.

Two ports 50 pass through the wall of the horn, and interconnect the chamber and the throat restriction. They enter the throat restriction between the opening in the enclosure and the cone. In the illustrated embodiment, there are two such ports. They are formed rectangularly, such as by a plunge cut or a saw cut. Alternatively, they could be round holes. They may occupy more of the periphery of the wall and be thinner, or less and be thicker, but they should open into the restriction at or very near to the region having the minimum area.

It will be observed that the woofer and tweeter are both supported by the horn. The horn in turn is mounted to the enclosure. The rear end of the horn is spaced from the rear wall of the chamber.

A very effective speaker has been made with the following approximate dimensions:

Face of enclosure: 27×19 inches.
Depth of enclosure: 14 inches.
Spacing of rear end of horn from rear wall: 1¼ inches.
Speaker cone: 10 inches largest diameter.
Horn forward opening: about 26×18 inches.
Throat outer diameter: 5¾ inches.
Woofer outer diameter forming restriction: 4¾ inches.
Ports two (2) in number, each 3 inches in cross-section area.
Spider area in throat less than 1 square inch (total).
Enclosure: conveniently made of ¾ inch thick pressed board.

As design considerations, the total cross-section area (measured at their minimum sections) of the ports is between about 6% and about 15% of the frontal area of the woofer cone, i.e., the area of the largest lateral cross-section of the cone.

The area of the throat restriction is between about 8% and about 20% of the said frontal area.

The only fluid communication between the chamber and the inside of the horn is through ports 50.

Preferably a plurality of ports is provided, although only one could be used, if desired. However, at least two are preferably employed.

In a practical device, the spacing 28 must be sufficient so there is no physical interference between the wall and the cone. Customarily, spacing 28 will be at least 10% of the largest diameter of the speaker cone. Air can then flow from the cone to the chamber. The enclosed space surrounded by the enclosure and the horn act to invert the wave from the rear side of the cone, and reinforce the wave from the front side of the cone as it passes through the throat restriction at the throat (after passing through the ports, of course).

The size of the ports and of the throat restriction is matched to flatten the frequency of reproduction of the woofer through its bandpass.

The partial horn itself acts to transform the effective arear of the low frequency driver to three times its actual area.

As the consequence of the above-described loading, there is a reduction by approximately 60 to 70% of the low frequency driver cone excursion in the low frequency end of the bandpass. This greatly reduces intermodulation distortion, and doppler distortion. It reduces the harmonic distortion by about 6 to 10 db. It increases the efficiency of the speaker system by approximately 6 to 12 db.

This system effectively extends the low frequency driver bandpass to 2K to 6K Hz, thereby reducing the transducer elements to two drivers: a low frequency driver (woofer) and a tweeter. This accounts for low phase distortion. It also reduces crossover irregularities to one frequency.

The foregoing advantages are very pronounced and valuable. Yet at the same time they are attained by a system which is simplicity itself. The "working" parts of the system are all mounted to the cabinet at the forward opening, and the drivers are supported by the horn. This device can readily be manufactured in two subassemblies: the enclosure and the horn (which carries everything else).

This invention is not to be limited by the embodiments shown in the drawings and described in the description, which are given by way of example and not of limitation, but only in accordance with the scope of the appended claims.

I claim:

1. A sound reproducing system comprising:
an enclosure having a front wall, a rear wall, and peripheral walls continuously joining said front and rear wall, said front wall having an opening therein;
a horn mounted at its forward end to said front wall filling the cross-section of said opening, said horn forming a cantilevered structure extending rearwardly toward said rear wall and being spaced therefrom by a spacing, said horn forming with the enclosure a chamber, said horn narrowing from its rearward end to form a throat and again enlarging toward its forward end, said horn having a port means therethrough entering said throat and connecting it to said chamber, said port means being the only fluid communication between the chamber and the inside of the horn.
a speaker cone mounted to the rearward end of said horn and enlarging rearwardly, its forward face facing into said horn;
a woofer mounted to said horn partially filling the cross-section at the throat, and thereby forming with the inside wall of the horn at the throat a throat restriction, said port entering said throat at said restriction; and
said woofer being drivingly connected to said cone; and
a tweeter mounted to said woofer and facing toward said opening.

2. A sound reproducing system according to claim 1 in which said port means comprises a plurality of said ports.

3. A sound reproducing system according to claim 1 in which the total cross-section of said port means is between about 6% and about 15% of the frontal area of said speaker cone.

4. A sound reproducing system according to claim 1 in which the area of the throat restriction is between about 8% and about 20% of the frontal end of said speaker cone.

5. A sound reproducing system according to claim 4 in which the total cross-section of said port means is between about 6% and about 15% of the frontal area of said speaker cone.

6. A sound reproducing system according to claim 2 in which the total cross-section area of said ports is between about 6% and about 15% of the frontal area of said speaker cone.

7. A sound reproducing system according to claim 2 in which the area of the throat restriction is between about 8% and about 20% of the frontal end of said speaker cone.

8. A sound reproducing system according to claim 7 in which the total cross-section area of said ports is between about 6% and about 15% of the frontal area of said speaker cone.

* * * * *